US008152927B2

(12) United States Patent
Kaeppeler

(10) Patent No.: US 8,152,927 B2
(45) Date of Patent: Apr. 10, 2012

(54) CVD COATING DEVICE

(75) Inventor: Johannes Kaeppeler, Wuerselen (DE)

(73) Assignee: Aixtron AG (DE)

( * ) Notice: Subject to any disclaimer, the term of this patent is extended or adjusted under 35 U.S.C. 154(b) by 1222 days.

(21) Appl. No.: 11/284,987

(22) Filed: Nov. 22, 2005

(65) Prior Publication Data

US 2006/0112881 A1    Jun. 1, 2006

Related U.S. Application Data

(63) Continuation of application No. PCT/EP2004/050325, filed on Mar. 18, 2004.

(30) Foreign Application Priority Data

May 22, 2003    (DE) .................................. 103 23 085

(51) Int. Cl.
    *C23C 16/00* (2006.01)
(52) U.S. Cl. .......................... 118/730; 118/728; 118/729
(58) Field of Classification Search .................... 118/730
    See application file for complete search history.

(56) References Cited

U.S. PATENT DOCUMENTS

| 4,350,562 | A | * | 9/1982 | Bonu ............................. 438/748 |
| 5,782,979 | A | * | 7/1998 | Kaneno et al. ................ 118/500 |
| 6,001,183 | A |   | 12/1999 | Gurary et al. |
| 6,030,509 | A | * | 2/2000 | Fu-Kang et al. .......... 204/192.12 |
| 6,491,757 | B2 | * | 12/2002 | Halpin et al. ................. 118/666 |
| 2003/0209326 | A1 | * | 11/2003 | Lee et al. .................. 156/345.52 |
| 2003/0221624 | A1 | * | 12/2003 | Jurgensen et al. ............ 118/725 |

FOREIGN PATENT DOCUMENTS

| DE | 10043600 | 3/2002 |
| JP | 2002146540 | 5/2002 |

OTHER PUBLICATIONS

PCT International Search Report, Oct. 6, 2004, 2 pages.

* cited by examiner

*Primary Examiner* — Keath Chen
(74) *Attorney, Agent, or Firm* — St. Onge Steward Johnston & Reens LLC

(57) ABSTRACT

The invention relates to a method for depositing especially crystalline layers on one or more, especially crystalline substrates in a process chamber by means of reaction gases that are introduced into the process chamber and that undergo especially pyrolitic reactions. The device comprises a support plate, heated from one side, on which at least one compensation plate rests while forming a horizontal gap. In order to be better able to influence the surface temperature, the gap height of the horizontal gap can be varied or is locally variable in order to influence the local surface temperature of the compensation plate.

14 Claims, 5 Drawing Sheets

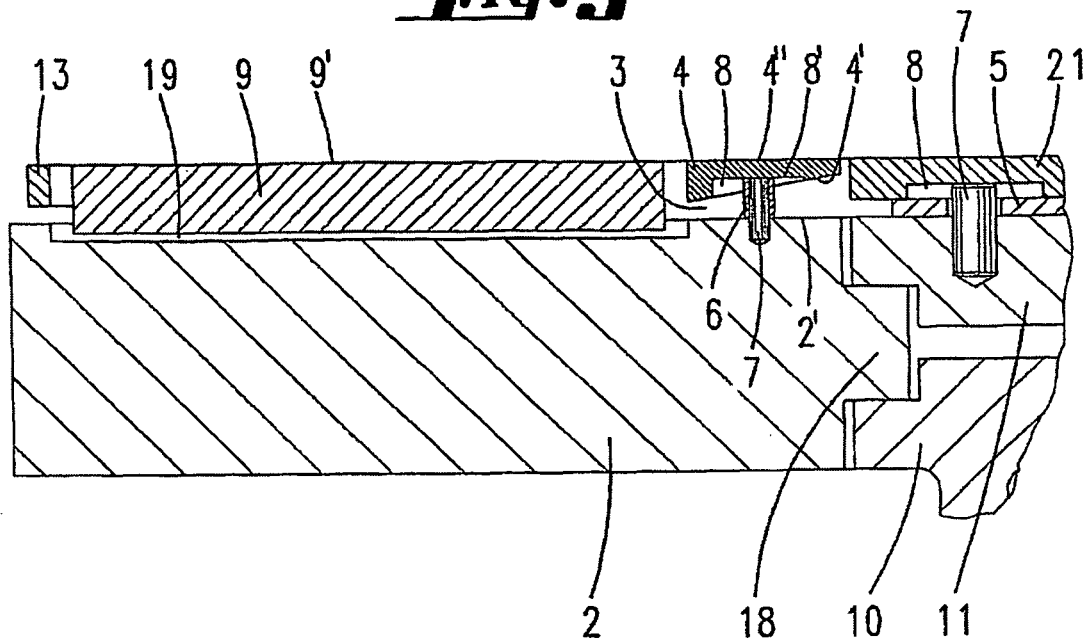
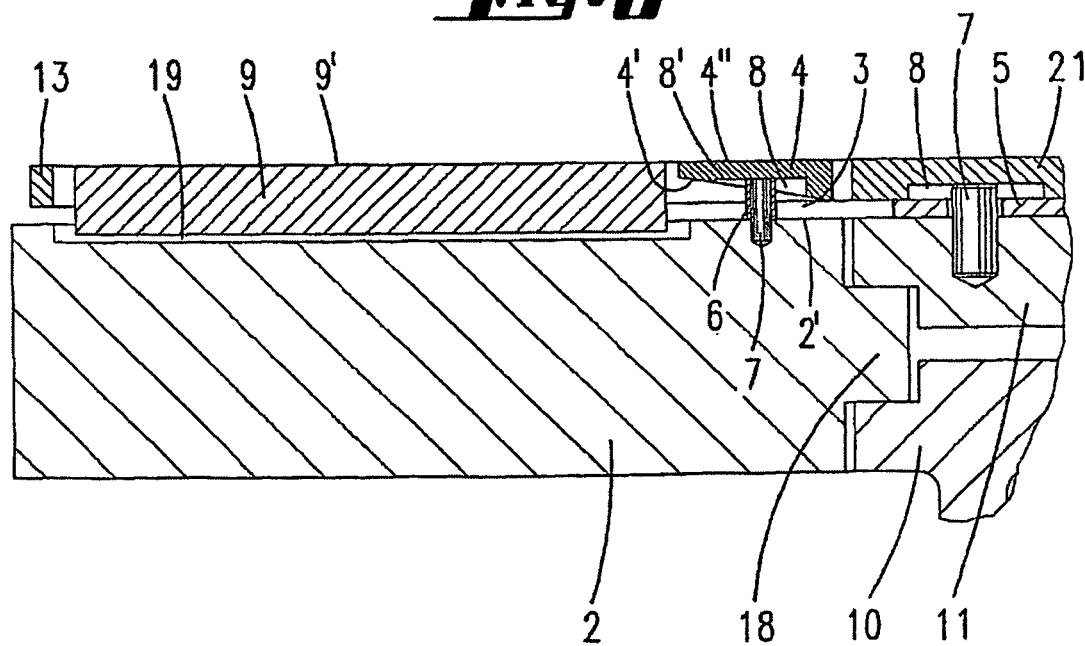

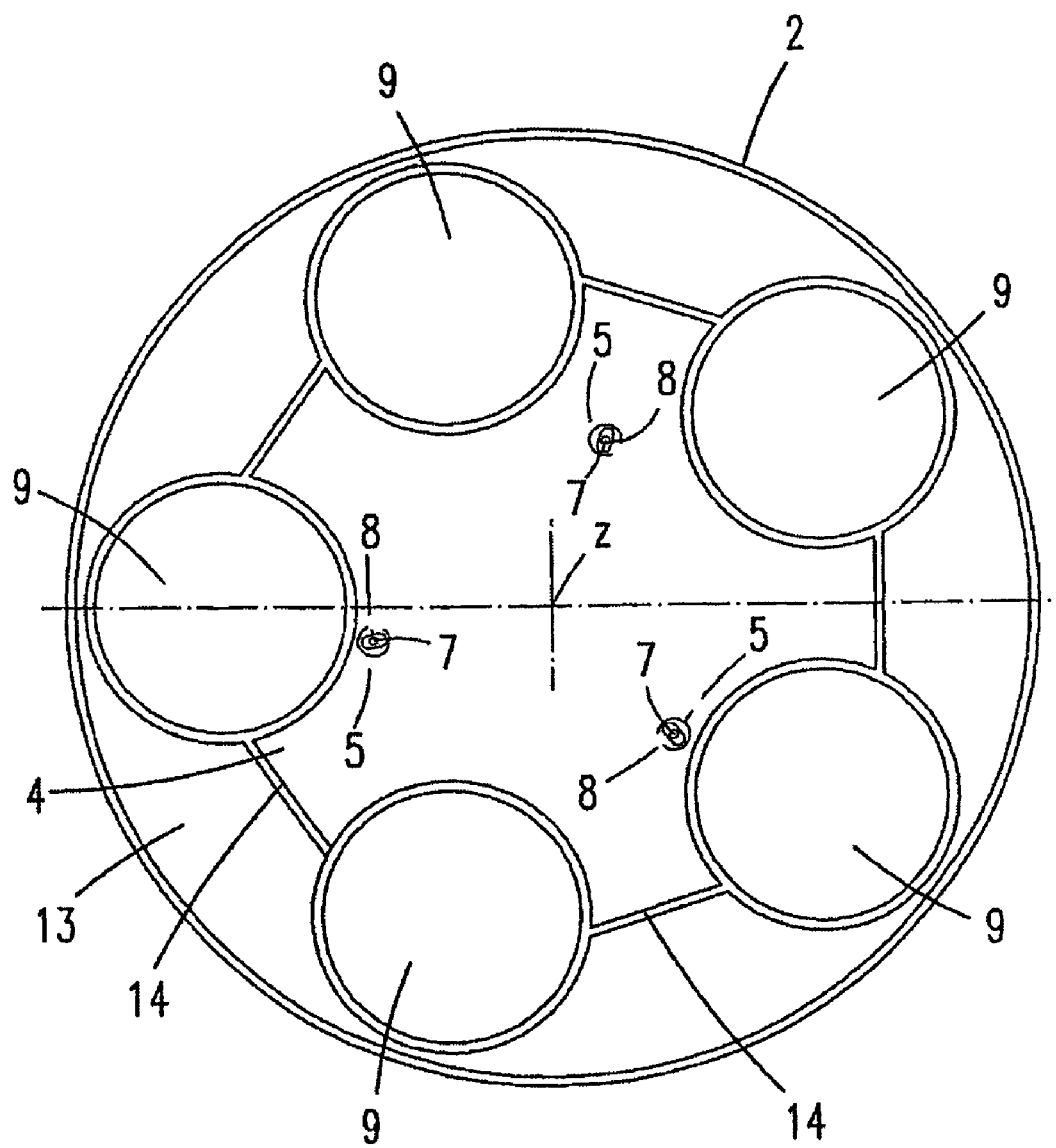

CVD COATING DEVICE

CROSS-REFERENCE TO RELATED APPLICATIONS

This application is a continuation of International Patent Application No. PCT/EP2004/050325 filed on Mar. 18, 2004, which designates the United States and claims priority of German Patent Application No. 10323085.8 filed on May 22, 2003.

FIELD OF THE INVENTION

The invention relates to a device for depositing in particular crystalline layers on one or more, in particular likewise crystalline substrates in a process chamber by means of reaction gases that are introduced into the process chamber and undergo pyrolytic reactions there, with a carrier plate which can be heated from one side and on which at least one compensation plate rests while forming a horizontal gap.

BACKGROUND OF THE INVENTION

A device of this type is described in DE 100 43 600 A1. The device described there has a process chamber. The process chamber there is formed in a rotationally symmetrical manner. A number of process gases are introduced into the process chamber through a gas inlet member disposed at the center of the ceiling in the process chamber. There, the process gases are broken down pyrolytically. To produce the temperature required for this, at least the base or the ceiling of the process chamber is heated. This may take place by infrared radiation or by high frequency.

The base of the process chamber there has a ring-shaped carrier plate. Individual substrate holders, rotationally driven on a gas cushion by means of streams of gas, are seated on the carrier plate. The substrate holders are mounted in recesses in the carrier plate. On the carrier plate, compensation plates rest on the area surrounding the substrate holders.

SUMMARY OF THE INVENTION

It is an object of the invention to provide measures to allow the surface temperature of the compensation plate to be adapted to the needs of the process in a simple way, in particular upstream of the substrate holder in the direction of flow.

The object is achieved by the invention specified in the claims.

Claim 1 provides first and foremost that the gap height of the horizontal gap is variable or locally different, to influence the local surface temperature of the compensation plate. As a result, the surface temperature can also be set independently of the distribution of the temperature of the carrier plate. To vary the gap height of the horizontal gap, it is envisaged in particular to define it by spacers. The gap height can be set by suitable choice of the spacers. Pins may be provided for mounting the spacers. For example, the pins may be fixedly connected to the carrier plate. Spacer disks or spacer sleeves can then be placed onto the pins. The pin or the sleeve may engage in a slot of the respective other plate. If, for example, the pin is fixedly inserted in a bore of the carrier plate, the free end of the pin may engage in a slot of the compensation plate. This makes it possible to compensate for different thermal expansion of the compensation plate and the carrier plate. It is preferred for a number of spacing means to be provided. It is preferred in particular if there are three of them. Each spacing means is held by a pin. Each pin protrudes into a slot. The slots in this case extend in the form of a star in relation to a center. Locally different gap heights can be produced by the underside of the compensation plate running in an inclined manner in relation to its upper side. This allows a wedge-shaped gap to be obtained. Since the heat transfer is dependent on the gap height, the regions of the compensation plate with which the greatest gap height is associated are supplied the least effectively with heat. Accordingly, these portions of the surface heat up less intensely than surface regions with which a small gap height is associated. In the case of the compensation plate with an underside running in an inclined manner, the spacers are preferably formed by spacer sleeves. The spacer sleeves are in this case supported on the bases of the slots. These bases run parallel to the upper side of the compensation plate. The compensation plates may be coated. The coating may be PBN, SiC or TaC. The compensation plates may also consist of SiC. Preferably they consist of quartz, graphite or coated graphite. The coating should consist of a material that is inert with respect to the process gases. It is of advantage if the device according to the invention has a central compensation plate which has arcuate cut-outs at its edge. These arcuate edges form a gap with respect to the rotationally driven circular disk-shaped substrate holders. The carrier plate may have the form of a ring. At the center of the ring there is a supporting plate and a tie plate. The supporting plate rests on a support. A tie rod acts on the center of the tie plate. As far as the configuration is concerned, reference is made to the representation of DE 100 43 600 A1.

The configuration of the device as provided by the invention makes it possible to prevent the surface temperature of the compensation plates in the vicinity of the substrate holder being significantly higher than the surface temperature of the substrate holder. It is even possible by suitable choice of the local gap height to set a specific temperature profile. The fact that the compensation plates, in particular the coated compensation plates, are exchangeable means that they can also be exchanged in a simple way when gases that attack graphite are used, such as for example ammonia. In the case of changed process parameters, the adaptation can take place by exchanging the spacing means. With the device according to the invention, it is also possible to achieve a situation in which a temperature profile that rises from the inside outward is established over the ring-shaped substrate holder in a planetary reactor. The temperature gradient in this case does not lead to any stresses that could cause the carrier plate or the compensation plate to be destroyed.

BRIEF DESCRIPTION OF THE DRAWINGS

Exemplary embodiments of the invention are explained below with reference to accompanying drawings, in which:

FIG. 5 shows a second exemplary embodiment of the invention, represented by an enlarged detail approximately along the line II-II in FIG. 1, FIG. 6 shows a further exemplary embodiment in a representation according to FIG. 5 and FIG. 7 shows a further exemplary embodiment of the invention in a representation according to FIG. 1.

DETAILED DESCRIPTION OF THE INVENTION

Figure 1:
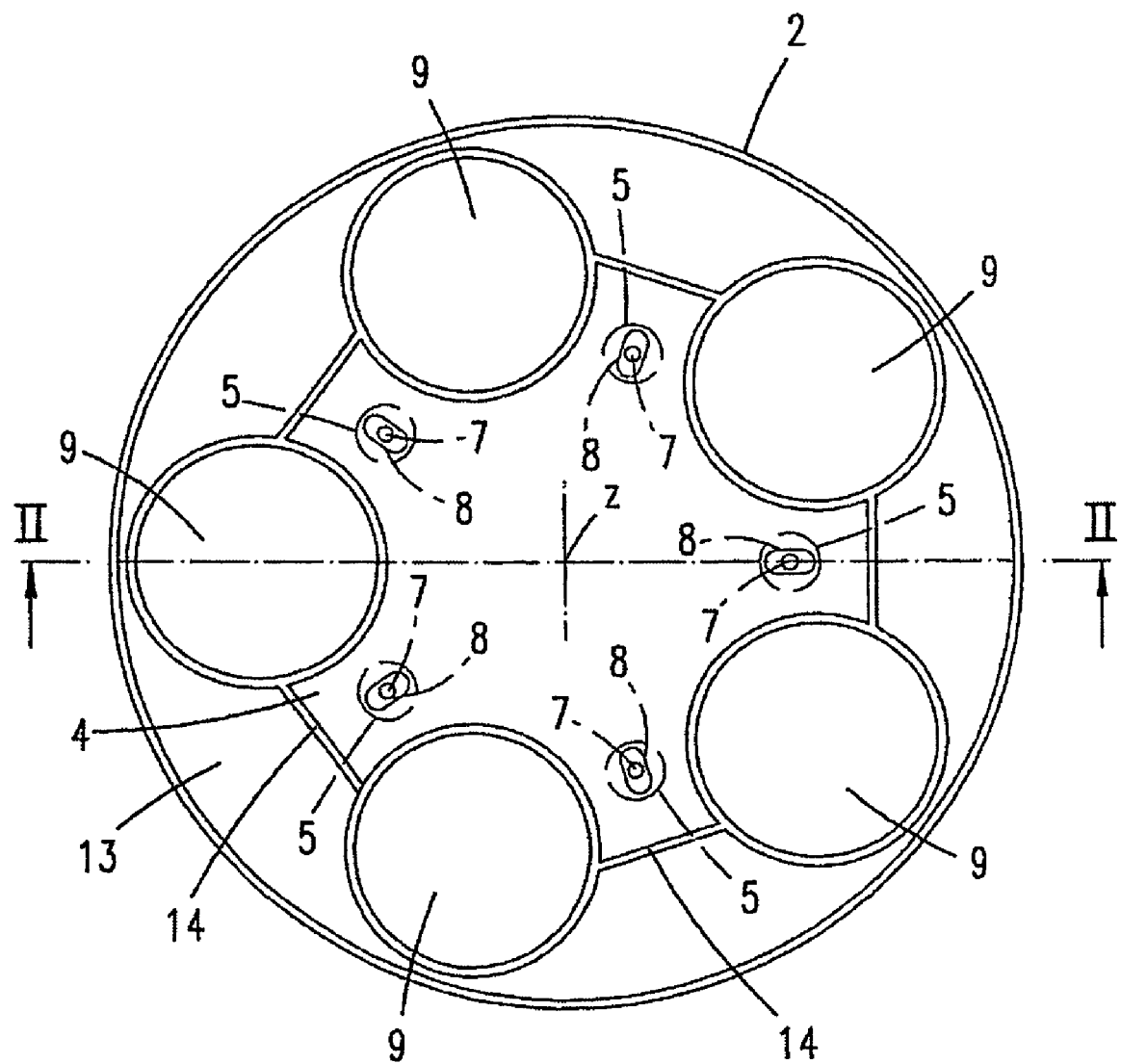
FIG. 1 shows a plan view of a carrier plate fitted with a number of compensation plates and substrate holders (the gaps between the compensation plates and the substrate holders are shown exaggerated to illustrate them better; in fact, the gaps should be as narrow as possible)
Figure 2:
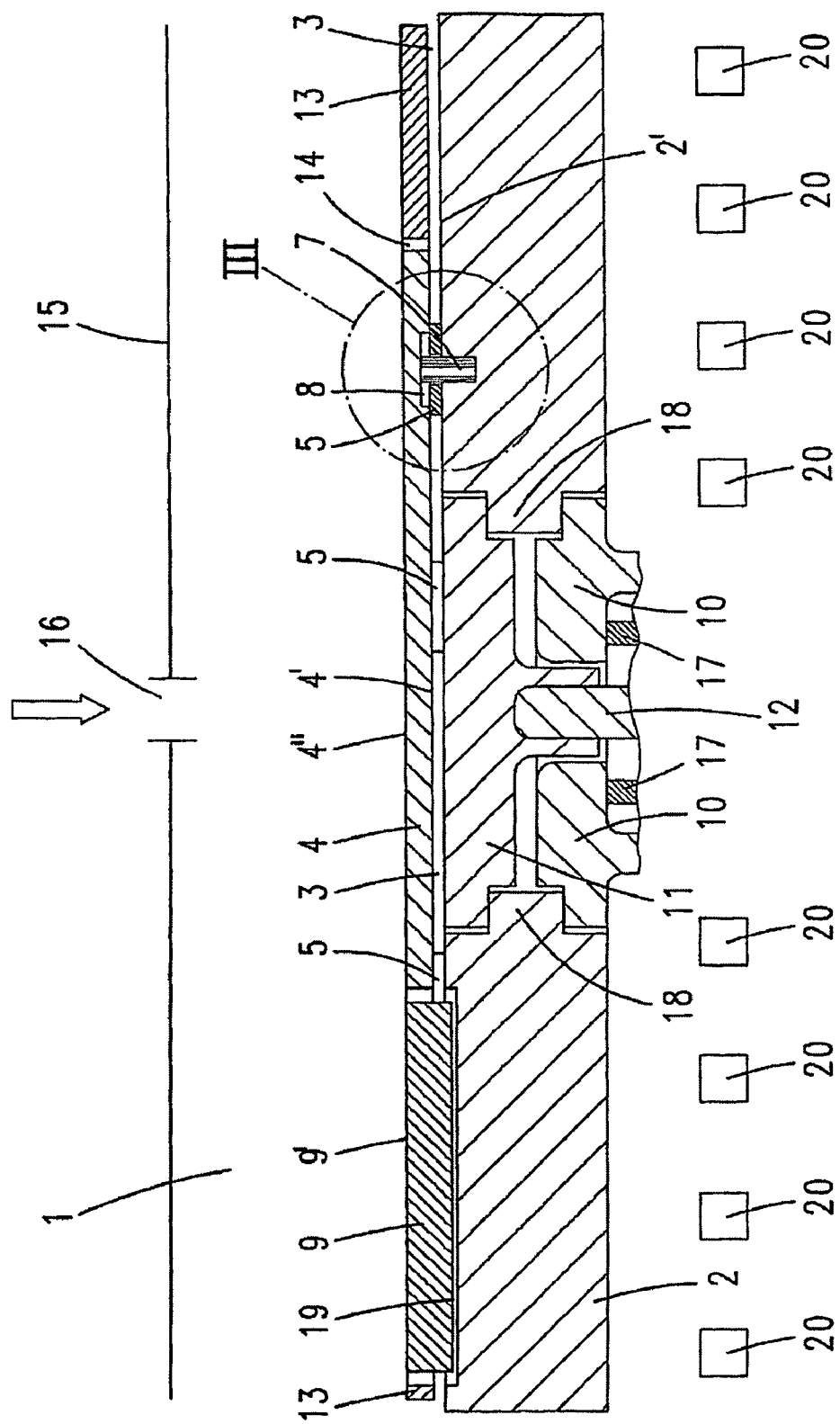
FIG. 2 shows a section along the line II-II in FIG. 1 through a process chamber.
Figure 3:
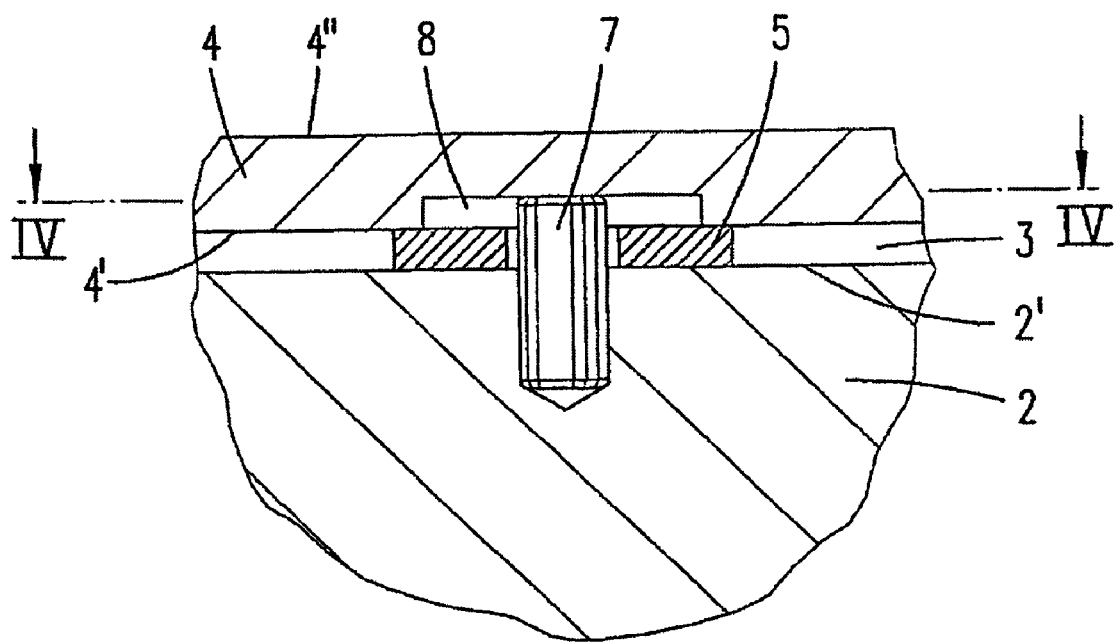
FIG. 3 shows an enlarged representation of the detail III in FIG. 2.
Figure 4:
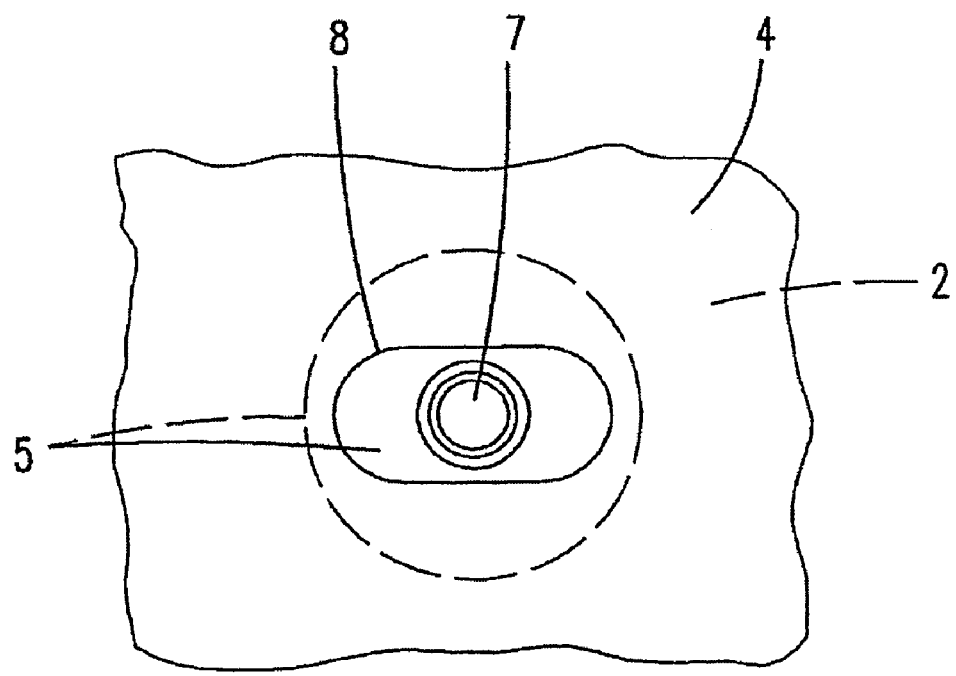
FIG. 4 shows a section along the line IV-IV in FIG. 3.

The use of compensation plates 4, 13, which are disposed on a carrier plate 2, allows the thermal conduction resistance in the horizontal gap 3 between the compensation plate 4 and the carrier plate 2 to be varied, in particular upstream of the substrate in the direction of the gas flow, from the center of a process chamber 1 to the edge of the process chamber 1. This allows the temperature on the upper side 4" of the covering plate 4 to vary independently of the temperature of the carrier plate 2 lying under it. The variation of the heat conduction resistance is made possible in particular by the distance between carrier plate 2 and compensation plate 4, that is the gap height of the horizontal gap 3. The distance is defined by insulating spacing means 5, 6. The spacing means, having the form of a disk 5 or a sleeve 6, may consist of ceramic, quartz or sapphire. According to the exemplary embodiment represented in FIG. 3, the horizontal gap 3 may have a substantially uniform gap height; the spacer disk 5 then rests on the upper side 2' of the carrier plate 2 and carries the underside 4' of the compensation plate 4. However, as represented in FIGS. 5 and 6, the gap height may also vary locally. The gap height of the horizontal gap 3 can be varied by exchanging the spacer disks 5 and spacer sleeves 6.

The exemplary embodiment represented in FIGS. 1 to 4 has a rotationally symmetrical process chamber 1. Process gases are introduced centrally into the process chamber through an inlet member that is merely indicated by the reference numeral 16 (for its precise configuration, see DE 190 43 600). The inlet member 16 is located at the center of the ceiling 15 of the process chamber 1.

The base of the process chamber 1 is formed by substrate holders 9 disposed around the center Z in the form of a ring. The substrates can rest on these substrate holders 9. The intermediate spaces between the individual substrate holders 9 are filled by compensation plates 4, 13. In the exemplary embodiment, a central compensation plate 4 is provided. In the exemplary embodiment, there is only a single central compensation plate 4. It is adjoined by a total of five peripheral compensation plates 13. As can be gathered from FIG. 2 in particular, the central compensation plate 4 extends above a ring-shaped carrier plate 2, while forming a gas gap 3. The ring-form recess in the carrier plate 2 is filled by a tie plate 11. A tie rod 12 acts on the tie plate 11. The edge of the tie plate 11 is in this case supported on a collar 18 of the carrier plate 2. The collar 18 rests on an edge portion of a supporting plate 10, which extends parallel to the tie plate 11. The annular supporting plate 10 is supported on a support 17.

Located under the carrier plate 2, which consists of graphite, is the coil 20 of an HF heater, which heats up the carrier plate. In the carrier plate 2 there are also gas ducts (not represented), through which a stream of gas flows to form a gas cushion 19, on which the substrate holders 9 float. The stream of gas forming the gas cushion 19 also brings about self-rotation of the substrate holders 9. The carrier plate 2 may be rotationally driven about its axis.

In the region between the individual substrate holders 9, pins 7 extend from the upper side 2' of the carrier plate 2. Spacer disks 5 are fitted over the pins 7. The underside 4' of the compensation plate 4 rests on the spacer disks 5. The gap height of the horizontal gap 3 is consequently defined by the material thickness of the spacer disks. The free end of the pin 7, protruding beyond the upper side of the spacer disk 5, protrudes into a slot 8 associated with the underside 4' of the compensation plate 4. The five slots represented in FIG. 1 extend in the form of a star in relation to the center Z of the compensation plate 4. It is sufficient if the compensation plate 4 has only three slots. With these three slots 8 and the associated pins 7, the position of the compensation plate 4 in relation to the carrier plate 2 is defined. Different thermal expansions are compensated.

In the case of the exemplary embodiments represented in FIGS. 5 and 6, the compensation plate 4 lying directly upstream of the substrate holders 9 in the direction of flow is formed as a ring. In these two embodiments, the underside 4' of the ring-shaped compensation plate 4 runs in an inclined manner in relation to the upper side 4" or in an inclined manner in relation to the upper side 2' of the carrier plate 2. This produces a wedge-shaped horizontal gap 3. The different gap height results in a different heat transfer from the heated carrier plate 2 to the compensation plate 4, and consequently in a different surface temperature of the compensation plate 4. The upper side 4" of the compensation plate 4 and the upper side 9' of the substrate holder 9 are preferably in line with each other. In the interior space of the ring-shaped compensation plate 4 there is a compensation plate 21, which is kept at a vertical distance from the tie plate 11 in the way described above by means of spacers 5.

The definition of the height of the horizontal gap 3 is achieved in the case of the ring-shaped compensation plate 4 by spacer sleeves 6. Such a spacer sleeve 6, consisting of an insulating material, is supported by its one end on the upper side 2' of the carrier plate 2 and by its other end on the base 8' of the slot 8. The pin 7 thereby passes only partly through a central opening of the spacer sleeve 6. The base 8' of the slot 8 extends parallel to the upper side 2' of the carrier plate 2 or parallel to the upper side 4" of the compensation plate 4.

In the case of the exemplary embodiment represented in FIG. 5, the horizontal gap 3 tapers in the direction of the stream of gas, that is from the inside radially outward. In the case of the exemplary embodiment represented in FIG. 6, the horizontal gap 3 tapers from the outside radially inward.

The peripheral compensation plates 13 may rest directly on the upper side 2' of the carrier plate 2. The material of the compensation plates 4, 13 may be quartz, SiC or graphite. It is preferably graphite coated with TaC or SiC.

In the case of the exemplary embodiment represented in FIG. 7, only three spacing means 5 are provided, disposed such that they are angularly offset by 120° in relation to the center.

All disclosed features are (in themselves) pertinent to the invention. The disclosure content of the associated/attached priority documents (copy of the prior patent application) is also hereby incorporated in full in the disclosure of the application, including for the purpose of incorporating features of these documents in claims of the present application.

What is claimed is:

1. A device for depositing crystalline layers on one or more crystalline substrates in a process chamber by means of reaction gases that are introduced into the process chamber and undergo pyrolytic reactions therein, comprising:

a carrier plate which can be heated from one side;

at least one substrate holder resting above the carrier plate and holding at least one crystalline substrate;

at least one compensation plate disposed upstream of the at least one substrate holder such that reaction gases reach the at least one crystalline substrate only after passing over the compensation plate, wherein the compensation plate is distinct from and at least partially surrounds the substrate holder and rests above the carrier plate so as to form a horizontal gap; and at least one first spacer, being a separate part that is removable from the device and being exchangeable with at least one second spacer having a different height, disposed between the carrier plate and the at least one compensation plate for defining the gap height;

wherein the gap height of the horizontal gap upstream of the substrate holder in the direction of flow is variable by exchanging the at least one first spacer for the at least one second spacer to influence the local surface temperature of the compensation plate.

2. A device according to claim 1, characterized in that the at least one spacer is formed as a disk or sleeve fitted over a pin.

3. A device according to claim 2, characterized in that the pin, fixedly connected to the carrier plate or the compensation plate, or a sleeve carried by said pin, engages in a slot of the respective other plate.

4. A device according to claim 1, characterized in that a number of pins, preferably three, respectively engage in a slot, the slots being aligned about a common center.

5. A device according to claim 1, characterized by a wedge-shaped progression of the gap height.

6. A device according to claim 1, characterized in that the underside of the compensation plate runs in an inclined manner in relation to its upper side.

7. A device according to claim 1, characterized in that the base of a slot associated with the inclined underside runs parallel to the upper side of the compensation plate or the upper side of the carrier plate.

8. A device according to claim 3, characterized in that the sleeve carried by a pin extending from the upper side of the carrier plate is supported on the base of the slot, or a disk passed through by the pin supports the edge of the slot.

9. A device according to claim 1, characterized in that the spacer comprises one or more of the group of sapphire, quartz, and/or ceramic.

10. A device according to claim 1, characterized in that the compensation plate consists of quartz, SiC or graphite coated with PBN, TaC or SiC.

11. A device according to claim 1, characterized by a central compensation plate partly enclosing a number of substrate holders rotatably associated with the carrier plate in the form of a ring.

12. A device according to claim 1, characterized in that the carrier plate has the form of a ring and is carried from below by a central supporting plate by engagement under the edge, a tie plate which lies over the supporting plate and on which a tie rod acts being supported on the edge of the carrier plate.

13. A device according to claim 1, characterized in that the carrier plate is rotationally driven and the substrate holders are rotatable, are respectively resting on a gas cushion, and are rotationally driven by streams of gas forming the gas cushion.

14. A device for depositing crystalline layers on one or more crystalline substrates in a process chamber by means of reaction gases that are introduced into the process chamber and undergo pyrolytic reactions therein, comprising:

a carrier plate which can be heated from one side;

at least one substrate holder resting above the carrier plate and holding at least one crystalline substrate;

at least one compensation plate disposed upstream of the at least one substrate holder such that reaction gases reach the at least one crystalline substrate only after passing over the compensation plate, wherein the compensation plate is distinct from and at least partially surrounds the substrate holder and rests above the carrier plate so as to form a horizontal gap; and at least one first spacer disposed between the carrier plate and the at least one compensation plate for defining the gap height;

at least one second spacer, having a height different than said at least one first spacer and being exchangeable with said at least one first spacer;

wherein the gap height of the horizontal gap upstream of the substrate holder in the direction of flow is variable by exchanging the at least one first spacer for the at least one second spacer to influence the local surface temperature of the compensation plate; and wherein the at least one spacer is formed as a disk or sleeve fitted over a pin.

* * * * *